United States Patent [19]

Schierz et al.

[11] Patent Number: 4,499,485
[45] Date of Patent: Feb. 12, 1985

[54] SEMICONDUCTOR UNIT

[75] Inventors: Winfried Schierz, Roth; Helmut Creutz, Zirndorf, both of Fed. Rep. of Germany

[73] Assignee: SEMIKRON Gesellschaft für Gleichrichterbau und Elektronik mbH, Nuremberg, Fed. Rep. of Germany

[21] Appl. No.: 543,787

[22] Filed: Oct. 20, 1983

Related U.S. Application Data

[63] Continuation of Ser. No. 234,429, Feb. 13, 1981.

[30] Foreign Application Priority Data

Feb. 13, 1980 [DE] Fed. Rep. of Germany ....... 3005313

[51] Int. Cl.³ ............................................ H01L 23/02
[52] U.S. Cl. ........................................ 357/74; 357/75; 357/76; 357/79; 357/80
[58] Field of Search ................... 357/74, 75, 76, 79, 357/80

[56] References Cited

U.S. PATENT DOCUMENTS

| | | | |
|---|---|---|---|
| 3,486,103 | 12/1969 | Boksjo | 357/75 |
| 3,654,527 | 4/1972 | McCann | 357/74 |
| 3,723,836 | 3/1973 | Shekerjian et al. | 357/75 |
| 3,864,607 | 2/1975 | Phillips | 357/81 X |
| 3,885,243 | 5/1975 | Weisshoar et al. | 357/79 |
| 4,008,487 | 2/1977 | Vogt | 357/79 X |
| 4,047,197 | 6/1977 | Schierz | 357/75 |
| 4,063,348 | 12/1977 | Borden et al. | 29/588 |
| 4,068,368 | 1/1978 | DeBard et al. | 29/588 |
| 4,106,052 | 8/1978 | Schierz | 357/72 |
| 4,218,695 | 1/1980 | Egerbacher et al. | 357/75 |
| 4,313,128 | 1/1982 | Schlegel et al. | 357/75 |
| 4,352,120 | 9/1982 | Kurihara et al. | 357/75 |
| 4,383,355 | 5/1982 | Eisele | 357/79 |

FOREIGN PATENT DOCUMENTS

| | | |
|---|---|---|
| 2604722 | 9/1976 | Fed. Rep. of Germany . |
| 2617335 | 11/1977 | Fed. Rep. of Germany . |
| 2639979 | 3/1978 | Fed. Rep. of Germany . |
| 2641032 | 3/1978 | Fed. Rep. of Germany . |

Primary Examiner—Martin H. Edlow
Attorney, Agent, or Firm—Spencer & Frank

[57] ABSTRACT

In a semiconductor unit composed of at least two semiconductor members each provided at each end with a respective current contact, a housing including a metallic base plate and a cover, elements for mounting the semiconductor members in electrically insulated and thermally conductive communication with the base plate, external connecting leads, and spring elements for establishing pressure contact between the leads and the current contacts, the connecting leads include a lower lead in the form of a contact rail contacting the current contact at that end of each member which is directed toward the base plate and interposed between the base plate and the members, and an upper lead for each member arranged concentrically with its respective member and contacting the current contact at that end of its associated member which is directed toward the cover, the contact rail includes a free end region which extends through an opening in the housing to provide an external connection in a selected connection plane, the cover is provided with an opening for each upper lead through which the upper leads extend to provide further external connections, and the unit further includes a structure securing each upper lead against rotation relative to the housing.

30 Claims, 5 Drawing Figures

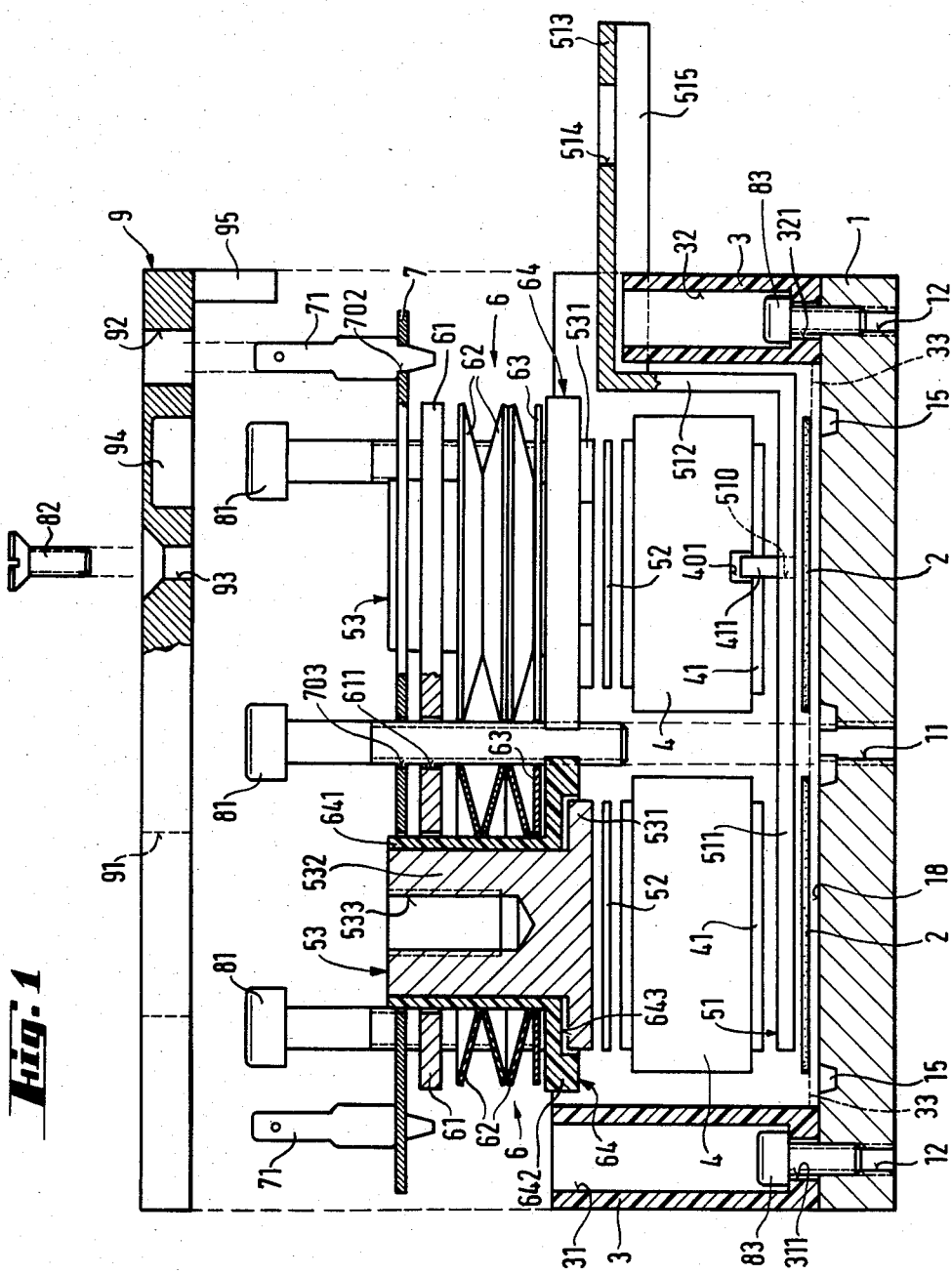

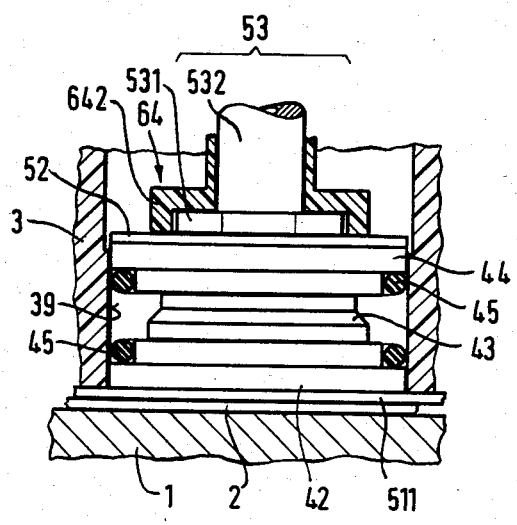

SEMICONDUCTOR UNIT

This application is a continuation of application Ser. No. 234,429, filed Feb. 13, 1981.

BACKGROUND OF THE INVENTION

The present invention relates to a semiconductor unit of the type including at least two semiconductor elements which are fastened in a housing to a metallic base plate in an electrically insulated and thermally conductive manner and provided with current conductor members which also form current terminals and which are contacted under the influence of pressure exerted by spring bodies.

German Utility Model Patent No. 7,512,573 discloses a semiconductor rectifier arrangement in which two semiconductor rectifier elements are fastened in electrical series connection, with their connecting components electrically insulated and thermally conductive to one side of a metallic base plate. The arrangement is embedded in an insulating mass in a plastic housing. The rectifier elements are connected together by a connecting conductor designed to form a third current conduction terminal in line with the other two current conduction terminals and located at one end of the resulting row of three current conduction terminals. The outermost current conduction terminals in said row each are fastened to the associated rectifier element on a conducting layer and, via this layer and an insulating intermediate disc, together to the base plate.

Other prior art semiconductor rectifier arrangements are provided with rectifier elements which are pressure contacted in recesses of the housing and are encased in an insulating mass.

These prior art units have various drawbacks. For example, solder contacting of the rectifier elements is a complicated procedure. When the elements are pressure contacted and embedded in an insulating mass, the rigid encapsulation of the contacting system, which is intended to exhibit an elastic behavior during use, makes the structure susceptible to malfunction. Moreover, the process steps of soldering or encapsulating in the insulating mass, respectively, may adversely influence the electrical properties. Additionally, mechanical stresses due to differences in thermal expansion of adjacent materials frequently result in a reduction of quality. If the parameters of one or more rectifier elements should deteriorate, there is no chance for replacement so that the arrangement must be downgraded regarding its parameters or becomes unusable.

Moreover, none of the prior art structures meets the demands of manufacturers who wish to repeatedly monitor the assembly stages without having to destroy semifinished arrangements and to be able to consider technically relevant factors in a desired manner. None of the prior art embodiments provides a design with selectable electrical orientation of the semiconductor elements. Finally, rectifier arrangements with current conducting terminals arranged in a row cannot always be used universally since they are limited to only one connecting plane.

SUMMARY OF THE INVENTION

Objects of the present invention are to avoid the above-mentioned drawbacks and to provide a semiconductor unit structure which permits more economical manufacture than the prior art devices with complete monitoring of all process stages without damage, to eliminate undesirable mechanical stresses on components, and to permit any desired electrical polarization of the semiconductor devices and universal use thereof.

The above and other objects are achieved, according to the invention, in a semiconductor unit composed of at least two semiconductor members each having two opposed ends and provided at each end with a respective current contact, a housing including a metallic base plate and a cover, means for mounting the semiconductor members in electrically insulated and thermally conductive communication with the base plate, external connecting leads, and spring means for establishing pressure contact between the leads and the current contacts, in that: the connecting leads include a lower lead in the form of a contact rail contacting the current contact at that end of each member which is directed toward the base plate and interposed between the base plate and the members; the contact rail includes a free end region which extends through an opening in the housing to provide an external connection in a selected connection plane; the connecting leads further include an upper lead for each member arranged concentrically with its respective member and contacting the current contact at that end of its associated member which is directed toward the cover; the cover is provided with an opening for each upper lead through which the upper leads extend to provide further external connections; and the unit further includes means securing each upper lead against rotation relative to the housing. Advantageously, mutually coinciding contactable semiconductor elements can be provided, for example those which are encapsulated in the form of discs, i.e. so-called press packs.

The semiconductor devices can also be constructed in such a way that the contact plates resting against the semiconductor body are disposed in a recess in the interior of the frame of the housing, which includes a metallic base plate as well as a frame and a cover of insulating material, the contact plates forming, in this recess, a tight seal for the semiconductor body with the aid of sealing rings.

According to the intended use, the component stacks may be arranged next to one another on a common contact rail and be electrically connected together via this rail, or each component stack may have its own associated contact rail.

In order to determine different switching planes for universal use, the components forming the respective upper connecting leads of the semiconductor elements are brought through an opening in the cover of the housing and form a first switching plane, and the free end of the contact rail is brought out of the housing parallel to the bottom plate to form the second switching plane. For this purpose, the free end of the contact rail may be disposed at a narrow side of the housing, the current terminals then preferably being arranged in a row, or at a long side of the housing. However, the free ends for the contact rails intended for separate wiring of the component stacks may also protrude separately from different sides of the housing or together from one long side of the housing.

The pressure contact system includes a pressure plate which acts together on all component stacks and, for each component stack, at least one spring element, a metallic pressure disc, a body of insulating material which electrically insulates the upper connecting lead against the pressure generating components, and screw elements.

For pressure contacting, the component stacks are pressed onto the contact rail by means of the pressure plate and the screw elements and are releasably fixed thereby to the bottom plate.

The upper connecting lead of each semiconductor element in the stack and the body of insulating material surrounding it are given a rotation-preventing configuration at their mutually adjacent sections and the body of insulating material is additionally provided with a projection that rests against a fastened component to inhibit rotation of the insulating material. For example, the adjacent sections may be designed to have coinciding polygonal shapes and be arranged to mutually interengage.

Special shapes are provided for the housing frame in order to accommodate the components and fix their position within the housing frame as well as for fastening them to the bottom plate. For example, the housing frame is provided on one side with a terminating plate provided with openings to receive the component stacks and to pass through the screw elements, the latter serving to releasably fixedly attach the frame together with the component stacks to the bottom plate.

In another embodiment, the housing frame is provided with sections having an increased wall thickness which contain at least one bore for separately fastening the frame to the bottom plate.

A further embodiment of the housing frame is provided with sections having a greater wall thickness and provided with matching bores for guiding the screw elements. However, the housing frame may also be formed of a massive body which is then provided with recesses for receiving the stacks of components and the contact rail, as well as with bores for passage of the screw elements. The correct positioning of the component stacks can also be realized by rib-shaped configurations in the interior of the housing frame.

Instead of special configurations within the housing frame, the correct position in the arrangement of the component stacks can also be realized by spacer elements which are provided between the housing frame and the component stacks. Preferably, the spacer elements are provided with bores for guiding the screw elements.

To reinforce the mechanical stability of the free end of the contact rail during the connection with current conductors, this free end can be designed as a longitudinal profile having at least one arm. The opening provided for passing this free end through the housing is then given a shape which is adapted to receive the longitudinal profile. The cover of insulating material which closes the housing frame is fastened on the pressure plate.

If controllable semiconductor devices are used, it is advantageous to provide a conductor plate for fastening the control lines and for bringing them through the housing, the conductor plate being disposed between the pressure plate and the housing cover.

BRIEF DESCRIPTION OF THE DRAWINGS

FIG. 1 is an elevational, partly cross-sectional, exploded view of a preferred embodiment of a semiconductor unit according to the invention.

FIG. 3 is an elevational view, partly in cross section, showing one form of semiconductor device used in embodiments of the invention.

In the various Figures, identical parts are identified by the same reference numerals.

DESCRIPTION OF THE PREFERRED EMBODIMENTS

Figure 2A:
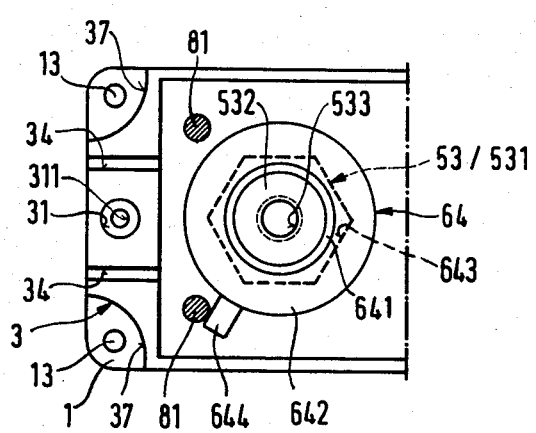
FIGS. 2a–2c are plan views illustrating several preferred embodiments of housing frames and associated components according to the invention.

FIG. 1 shows, partially in cross section, the structure of one preferred semiconductor unit. According to FIG. 1, the carrier for the semiconductor unit is a bottom plate 1 of metal having a high heat conductivity, plate 1 having, for example, a rectangular outline and being provided with planar contact faces. It is provided with threaded bores 11 for fastening the semiconductor devices and their contact components as well as with threaded bores 12 for fastening a housing frame 3. The upper surface of the bottom plate 1 contains continuous, annular groove-like recesses 15 each enclosing a planar surface section 18 on which a stack of components can be placed. The recesses 15 serve to assure the required creep path between current conducting members and the bottom plate against which they are electrically insulated. The surface sections 18 may also be formed by flat-topped raised portions on the bottom plate surface.

A disc of insulating material 2 is placed onto each surface section 18 to provide an electrically insulated but thermally conductive arrangement for a respective stack of components on the bottom plate 1. A correspondingly dimensioned disc 2 of insulating material also serves to provide the necessary insulating distance between the bottom plate 1 and the stack of components. Only one disc 2 may be used to cover all surface sections 18, otherwise each section may be covered by a separate disc.

A continuous, essentially strip-shaped contact rail 51 extends across and bears against the insulating discs 2. The dimensions of the contact rail 51 depend on the form and dimensions of the associated contact faces of the adjacent components and on the desired current carrying capability of the unit. The contact rail 51 forms one connecting lead for each of the semiconductor elements in the interior of the housing as well as their joint current terminal. The section 511 of the contact rail 51 forms the connecting lead which connects the semiconductor elements 4 together; the section 512 is the connecting piece between the connecting lead of the semiconductor elements in the interior of the housing and the current terminal 513. Terminal 513 is provided with a recess 514 for fastening an external current conductor. In order to increase the mechanical stability of the contact rail when the current conductors are fastened, the section 513 outside of the housing may be designed as a longitudinal profile having at least one profile bar 515.

The section 511 of the contact rail is provided, for example in the center of the contact area of the stack of components, with a bore 510 for accommodating a bolt 411 which serves to establish the position of the stack of components. For this purpose, a corresponding contact projection 41 on the semiconductor element 4 is provided with a recess 401 at a corresponding position.

Each semiconductor element 4 is disposed on a respective surface area provided on the contact rail section 511 for this purpose. These areas are preferably adapted to the respective surface sections 18 of the bottom plate 1. The semiconductor elements themselves are shown as so-called press packs. What is important to the invention is the use of mutually coinciding contactable semiconductor elements, i.e. elements which have a configuration of their connecting electrodes which is essentially identical at both ends. Together with the further feature of the present invention, i.e. a releasably arranged pressure contacting, this permits exchange of the semiconductor elements and furnishes the best quality units with the desired electrical polarization. Encapsulated elements with a disc-shaped housing are therefore of advantage.

A further advantageous form of construction is shown in FIG. 3, to be described later.

One contact disc 52 and a stamp-like upper connecting lead 53 are concentrically arranged on the upper current contact of each semiconductor element 4. Each connecting lead 53 includes a connecting plate 531 and a connecting shaft 532 which is provided with a blind threaded bore 533 and simultaneously forms a current terminal outside of the housing.

A pressure contactng system 6 is mounted on each connecting lead 53 via a body 64 of insulating material for providing electrical insulation against current conducting components. System 6 includes a pressure disc 63, spring elements 62 and a pressure plate 61 which is common to both stacks of components. In virtue of the required mechanical stability during the pressure contacting preferably a pressure plate 61 of steel is provided.

The pressure plate 61 is provided with bores 611 for passage through and fixing of screw elements for the pressure contacting system. The long portion 641 and the flange portion 642 of each body 64 of insulating material enclose, in a matching configuration, the associated connecting lead 53 to the extent that the connecting plate 531 extends into a recess 643 of the flange portion 642.

The structure of the pressure contact system 6 is known per se and is not by itself part of the invention.

According to the present invention, the semiconductor elements 4 and their contact components, i.e. their respective concentrically attached and axially extending upper connecting leads 53, are releasably contacted and fixed to the bottom plate 1 with the aid of the common pressure plate 61 and the screw elements 81 which are screwed into the threaded bores 11 of the bottom plate 1 and press the pressure plate 61 onto the spring bodies 62 with a concentrically uniform pressure. This can be seen from the arrangement, orientation and position of the threaded bore 11 for the center one of the illustrated screw elements 81.

The number and arrangement of the screw elements 81 around the circumference of each stack of components are determined by the fact that the pressure plate is to exert an approximately uniformly acting concentric pressure on each stack. This can already be realized by providing three connecting screws 81 for each stack of components, i.e. by providing each stack with three associated screw elements 81 which are mutually angularly offset essentially by 120°. Since a screw element attached in the area between two stacks of components spreads its effect to both stacks, it is possible to provide, in a structure involving two stacks, one screw element on the longitudinal axis of the housing between the stacks of components and two screw elements between each stack and the housing wall with an offset by the corresponding angle as shown in broken lines in FIG. 2c. With such an arrangement, the contact rail 51 is provided with a corresponding opening 5111, also shown in broken lines in FIG. 2c, for passage of a screw element 81.

Figure 2B:
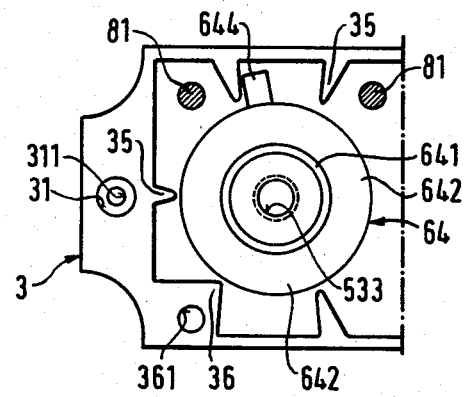
Figure 2C:
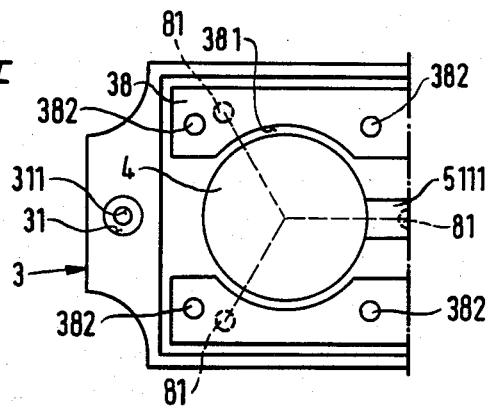

According to another preferred embodiment a four-screw connection is provided for each stack of components, with two screw elements 81 disposed on the center axis between the stacks of components, and two further screw elements provided in the area between each stack of components and the associated narrow side of the housing, as can be seen in FIG. 2c where bores 382 are provided for screws 81.

Reverting to FIG. 1, the stacks of components are accommodated in the housing frame 3 which is of insulating material, preferably plastic. The frame 3 is fastened directly to the bottom plate 1 and its circumference is essentially adapted to that of the bottom plate. For this purpose, the frame may be designed, for example, only as an annular body having, for example, a rectangular cross section, with one of its frontal, or end, faces adjacent the bottom plate 1 and its other frontal face adjacent a cover 9.

The housing frame 3 may be attached to the bottom plate, for example, by gluing. However, it may also be provided with sections having an increased end wall thickness and provided with stepped coaxial bores 31 and 311, or 32 and 321, respectively, for screwing screws 83 into threaded bores 12 of the bottom plate 1.

Furthermore, the housing frame 3 may be provided with an end plate 33 which is adjacent to the bottom plate 1. This end plate 33 has openings for passage of the stacks of components and the screw elements 81 of the pressure contact system 6 so that the housing frame 3 can also be releasably fastened to the bottom plate 1 together with the stacks of components.

The height of the housing is dimensioned so that with the cover 9 in place only the upper connecting lead 53 of each semiconductor element and the section 513 of the contact rail 51 outside of the housing are accessible.

If controllable semiconductor elements are provided, a conductor plate 7 is applied on the pressure plate 61 for fastening and bringing through the control lines. This conductor plate 7 is provided with openings 702 for attaching contact lugs 71 and recesses 703 for passage of the screw elements 81 and the connecting leads 53.

The housing frame 3 is closed by means of the cover 9 which is provided with openings 91 for passage of the connecting leads 53 and openings 92 for passage of the contact lugs 71. In the illustrated embodiments, it is further provided with recesses 94 for accommodating, in the interior of the housing, the upper ends of the screw elements 81. However, the semiconductor unit may also be dimensioned in such a manner that the screw elements 81 end below the cover 9. The cover further includes bores 93 for screws 92 to fasten the cover onto the pressure plate 61.

The semiconductor unit can thus always be disassembled due to the releasable screw connection of all components so that it is easy to replace components.

An opening remaining between the housing frame 3 and the cover 9 in the region of the contact rail section 513 is closed, for example, by a downward extension 95 of the cover 9.

The minimum mutual distance between the stacks of components in the housing is determined only by the requirement for sufficient voltage sparkover protection. In the embodiment according to FIG. 1, the contact rail 51 connects the lower current contacts of the semiconductor elements 4. If a separate contact rail is to be associated with each of the elements for independent operation of the semiconductor elements, the unit according to the invention can be assembled of two identical halves each corresponding to the right half of FIG. 1, and thus includes two separate contact rails. The free ends of the two contact rails may here be applied at the same level or at respectively different levels and may come out of the housing together on one side or separately at different sides of the housing.

The connecting plane for contact rail section 513, which is preferably disposed lower than the contacting face of the connecting leads 53, permits any desired electrical connection of the individual elements and/or of the unit with respect to circuitry and combination of components.

FIGS. 2a through 2c each show an example for a design of the housing frame for the fixed mounting of the stacks of components, each Figure showing one half of a unit. The frame 3 according to FIG. 2a has narrow sides of increased thickness, each narrow side having stepped bores 31 and 311 for separate fastening to the bottom plate 1, as this is also shown in FIG. 1.

In symmetry with the longitudinal axis of the housing, two slot-shaped recesses 34 are provided for accommodating the profile arms 515 of the contact rail 51 (see FIG. 1), for an arrangement in which the rail is provided with two such arms. The housing frame 3 which, for example, is essentially adapted to a rectangular bottom plate 1, has a rounded recess 37 at each corner to expose a respective bore 13 provided in the bottom plate 1 for fastening the unit to a cooling body or an instrument. The shaft 532 of the connecting lead 53 provided with the blind threaded bore 533 is enclosed by the long portion 641 of the body 64 of insulating material. Its flange member 642 has a cam-shaped projection 644. To prevent rotation of the connecting lead 53 when a current conductor is being attached by being screwed into bore 533, the recess 643 of the enclosing flange member 642 is designed, for example, in a polygonal shape and the connecting flange 531 of the connecting lead 53 is designed to match it and to engage therein. The cam-shaped projection 644 of the flange member 642 contacts a screw element 81 of the pressure contact system 6 to inhibit rotary movement of body 64.

Instead of positioning the stack of components by a screw element, this positioning can also be effected, for example, by means of positioning ribs 35 in the housing frame 3, as shown in FIG. 2b. These ribs can serve to fix the stacks of components and simultaneously to fix the upper connecting lead 53 against rotation, in that in virtue of the mutual fixing of the flange 53A and the projection 644 of the body 64 of insulating material said projection rests against such an adjusting rib, for example when the connecting components are released.

If, according to FIG. 2b, the adjusting ribs 35 are reinforced, e.g. in the form of columns 36 and attached to the corresponding points, they can each be provided with a bore 361 which simultaneously serves to guide a screw element 81 and thus to fix the housing frame 3 during the pressure contacting procedure. The bores 31 and 311 can then be omitted.

According to FIG. 2c, spacer members 38 which are disposed between the stacks and the housing walls are also suitable to fix the position of the stacks of components. These spacer members are essentially strip-shaped and have a matching recess 381 in the region of each semiconductor element 4, or of a stack of components each for its correct position, as well as correspondingly arranged bores 382 for the passage of the screw elements 81. Spacer members 38 can correspond in height of frame 3.

FIG. 3 shows a mutually coinciding contactable semiconductor element which has been formed in the housing frame 3 instead of a press pack. Such a semiconductor element shows a structure with identical contacting areas for its arrangement in an arbitrary electrical polarization.

To contact this element, a respective recess 39 is provided in the frame for each semiconductor element. This recess may be formed in a massive frame body or may be formed by rib-shaped projections between the frame walls, and is dimensioned for the insertion and guided arrangement of two contact plates 42 and 44 resting against opposite sides of the semiconductor body 43. The semiconductor body 43, whch is enclosed in the recess 39 between the contact plates 42 and 44, is tighly encapsulated, or sealed, along with its contact plates, by means of sealing rings 45 each disposed between a step-shaped edge zone of a respective contact plate and the wall of the recess inside the housing. A contact disc 52, connecting lead 53 and insulating body 64 are attached to this type of semiconductor element.

If the recesses 39 are provided in a massive housing body, the latter is preferably further provided with bores for the screw elements 81, if necessary with further bores for separately fastening the housing frame 3, and also with a recess for the engagement of each cam-shaped projection 644 to secure the connecting leads 53 against rotation.

The advantages of the present invention reside: in that it makes possible the best and most economical assembly without special treatment of components in a structure which meets all circuit requirements; in the assurance of predetermined parameters for the components and for the entire unit; in the possibility of monitoring the assembly without damage as desired; and in the fact that it is possible to arrange the semiconductor elements simply in any desired electrical polarization and to later change their polarization.

It will be understood that the above description of the present invention is susceptible to various modifications, changes and adaptations, and the same are intended to be comprehended within the meaning and range of equivalents of the appended claims.

What is claimed is:

1. In a semiconductor unit composed of at least two semiconductor members each having two opposed ends and provided at each end with a respective current contact, a housing including a metallic base plate and a cover, means for mounting the semiconductor members in electrically insulated and thermally conductive communication with the base plate, external connecting leads, and spring means for establishing pressure contact between the leads and the current contacts, the improvement wherein:

said connecting leads comprise at least one contact rail which defines a lower lead contacting said current contact at that end of at least one of said members which is directed toward said base plate and interposed between said base plate and said at least one of said members;

said contact rail includes a free end region which extends through an opening in said housing to provide an external connection in a selected connection plane;

said connecting leads further comprise an upper lead for each said member arranged concentrically with its respective member, contacting said current contact at that end of its associated member which is directed toward said cover, and provided with threaded means for establishing a screw connection with an external conductor;

said cover is provided with an opening for each said upper lead through which said upper leads extend to expose said threaded means of each said upper lead for connection to an associated external conductor; and said unit further comprises means securing each said upper lead against rotation relative to said housing.

2. An arrangement as defined in claim 1 wherein said members are identical to one another.

3. An arrangement as defined in claim 2 wherein said housing encloses a plurality of regions each containing a respective semiconductor member and further comprising removable annular sealing elements sealing the region containing each said semiconductor member from the outside.

4. An arrangement as defined in claim 2 wherein: said housing further comprises a frame extending between said base plate and said cover, defining the lateral boundaries of said housing and presenting at least two recesses each holding a respective semiconductor member; and said unit further comprises two contact plates associated with each said member and each contacting a respective current contact of its associated member, and a sealing ring disposed between each said contact plate and the associated recess for hermetically sealing each said semiconductor member from the outside.

5. An arrangement as defined in claim 1 wherein each said semiconductor member comprises a stack of semiconductor elements, and said contact rail connects together said current contacts at the end of said members directed toward said base plate.

6. An arrangement as defined in claim 1 wherein said connecting leads comprise at least two contact rails each connected to one current contact of only a respective one of said members.

7. An arrangement as defined in claim 1 wherein said upper leads extend out of said housing to define a first connection plane and said free end region of said contact rail extends out of said housing parallel to said base plate and defines a second connecting plane.

8. An arrangement as defined in claim 7 wherein said housing has a rectangular outline, and said free end region of said contact rail extends through an opening in a narrow side of said housing and lies in a row with said upper leads.

9. An arrangement as defined in claim 7 wherein said housing has a rectangular outline, and said free end region of said contact rail extends through an opening in a long side of said housing.

10. An arrangement as defined in claim 9 wherein said connecting leads comprise at least two contact rails each connected to one current contact of only a respective one of said members, with said free end regions of both said rails extending through respective openings in one long side of said housing.

11. An arrangement as defined in claim 1 wherein: said spring means comprise a pressure plate acting in common on all of said semiconductor members, and a contacting assembly for each said semiconductor member, each said contacting assembly including at least one spring body and a metallic pressure disc pressing said upper and lower leads of said associated semiconductor member against said associated current contacts; and said assembly further comprises a body of insulating material disposed for electrically insulating said associated upper lead against the pressure generating elements of said assembly, and screw elements.

12. An arrangement as defined in claim 1 wherein said means securing each said upper lead comprise a body of insulating material disposed for electrically insulating said upper lead, with said upper lead and its associated body of insulating material having mutually contacting surfaces configured to prevent rotation therebetween, and a projection carried by said body of insulating material and resting against a stationary surface in said housing to prevent rotation of said body of insulating material in said housing.

13. An arrangement as defined in claim 12 wherein said mutually contacting surfaces are identical polygons and interengage one another.

14. An arrangement as defined in claim 1 wherein said housing further comprises a frame extending between said base plate and cover and defining the lateral boundaries of said housing, screw elements releasably fastening said frame to said base plate, and an end plate secured to said frame at the end thereof adjacent said base plate and provided with openings for passage of said semiconductor members and of said screw elements.

15. An arrangement as defined in claim 1 wherein said housing further comprises a frame provided with regions of increased wall thickness presenting bores for the passage of screw elements to independently fasten said frame to said bottom plate.

16. An arrangement as defined in claim 1 wherein said housing further comprises a frame extending between said base plate and cover, defining the lateral boundaries of said housing, and provided with regions of increased wall thickness extending between said base plate and cover and provided with bores for the passage of screw elements between said cover and said base plate.

17. An arrangement as defined in claim 1 wherein said housing further comprises a frame extending between said base plate and cover, defining the lateral boundaries of said housing, and constituted by a massive body provided with recesses for holding said semiconductor members and said contact rail, and provided with bores for the passage of screw elements for fastening said base plate and frame together.

18. An arrangement as defined in claim 1 wherein said housing further comprises a frame extending between said base plate and cover, enclosing said semiconductor members, and provided with rib-shaped projections for positioning each said semiconductor member in said housing.

19. An arrangement as defined in claim 1 wherein said housing further comprises a frame extending between said base plate and cover and enclosing said semiconductor members, and spacer elements disposed between said frame and said members for fixing said members in said housing and provided with bores for passage of screw elements for fastening said spacer elements to said base plate.

20. An arrangement as defined in claim 1 wherein said free end region of said contact rail has the form of a longitudinal profile provided with at least a strengthening bar, and the opening in said housing through which said free end region extends has a shape adapted to that of said profile.

21. An arrangement as defined in claim 1 wherein said housing further comprises a frame extending between said base plate and said cover and enclosing said semiconductor members, a pressure plate mounted on all of said semiconductor members, and means detachably fastening said housing cover to said pressure plate.

22. An arrangement as defined in claim 21 wherein each said semiconductor member is a controllable device having a control electrode in addition to its current contacts, and further comprising a support plate disposed between said pressure plate and said cover for supporting connectors for said control electrodes.

23. An arrangement as defined in claim 1 further comprising removable sealing means between said metallic base plate and cover of said housing.

24. An arrangement as defined in claim 21 wherein said frame and said cover are of insulating material.

25. An arrangement as defined in claim 1 wherein said semiconductor members are installed in said housing, with the aid of said means for mounting, in a manner to permit said semiconductor members to be individually removed from said housing, each opposed end of each said semiconductor member is contacted by an associated external connecting lead, and said semiconductor unit further comprises a common pressure element which is detachably mounted in said housing for pressing all of said semiconductor members between their associated connecting leads.

26. An arrangement as defined in claim 25 wherein each said semiconductor member comprises a stack of semiconductor elements.

27. An arrangement as defined in claim 25 wherein said common pressure element comprises a pressure plate acting in common on all of said semiconductor members, and screw means cooperating with said pressure plate for releasably securing said members to said base plate and pressing said members against said contact rail.

28. An arrangement as defined in claim 27 further comprising means detachably securing said cover to said pressure plate.

29. An arrangement as defined in claim 28 wherein said pressure plate is of metal.

30. An arrangement as defined in claim 27 wherein said screw means comprise a plurality of screws associated with each said semiconductor member and disposed about the associated semiconductor member for causing said pressure plate to exert on the associated semiconductor member a pressure which is at least approximately uniform about the axis of the associated semiconductor member.

* * * * *